United States Patent
Shibata et al.

(10) Patent No.: US 11,251,338 B2
(45) Date of Patent: Feb. 15, 2022

(54) DEEP ULTRAVIOLET LIGHT-EMITTING ELEMENT

(71) Applicant: DOWA Electronics Materials Co., Ltd., Tokyo (JP)

(72) Inventors: Tomohiko Shibata, Akita (JP); Takehiro Miyaji, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 17/045,179

(22) PCT Filed: Apr. 18, 2019

(86) PCT No.: PCT/JP2019/016694
§ 371 (c)(1),
(2) Date: Oct. 5, 2020

(87) PCT Pub. No.: WO2019/203322
PCT Pub. Date: Oct. 24, 2019

(65) Prior Publication Data
US 2021/0167250 A1    Jun. 3, 2021

(30) Foreign Application Priority Data

Apr. 20, 2018  (JP) .............................. JP2018-081703
Apr. 17, 2019  (JP) .............................. JP2019-078464

(51) Int. Cl.
*H01L 33/32*   (2010.01)
*H01L 33/08*   (2010.01)

(52) U.S. Cl.
CPC ............ *H01L 33/325* (2013.01); *H01L 33/08* (2013.01)

(58) Field of Classification Search
CPC ........ H01L 33/08; H01L 33/325; H01L 33/38
See application file for complete search history.

(56) References Cited

U.S. PATENT DOCUMENTS

| 8,227,789 B2 | 7/2012 | Hirayama et al. |
| 8,330,168 B2 | 12/2012 | Ohta et al. |

(Continued)

FOREIGN PATENT DOCUMENTS

| JP | 2010161311 A | 7/2010 |
| JP | 2010205767 A | 9/2010 |

OTHER PUBLICATIONS

Jun. 15, 2021, Office Action issued by the Taiwan Intellectual Property Office in the corresponding Taiwanese Patent Application No. 108113904.

(Continued)

*Primary Examiner* — Matthew C Landau
*Assistant Examiner* — Dmitriy Yemelyanov
(74) *Attorney, Agent, or Firm* — Kenja IP Law PC

(57) ABSTRACT

A deep ultraviolet light-emitting element of this disclosure includes, in this order, an n-type semiconductor layer; a light-emitting layer; and a p-type semiconductor layer. An emission spectrum of the deep ultraviolet light-emitting element has a primary emission peak wavelength in a wavelength range of 200 nm or more and 350 nm or less, and a blue-violet secondary light emission component having a relative emission intensity of 0.03% to 10% across a wavelength range of 430 to 450 nm, a yellow-green secondary light emission component having a relative emission intensity of 0.03 to 10% across a wavelength range of 540 to 580 nm, when the relative emission intensities are expressed relative to an emission intensity at the primary emission peak wavelength taken as 100%. The ratio of an emission intensity at a wavelength of 435 nm to an emission intensity at a wavelength of 560 nm is 0.5 to 2.

5 Claims, 4 Drawing Sheets

(56) References Cited

U.S. PATENT DOCUMENTS

| | | | |
|---|---|---|---|
| 2005/0001225 A1* | 1/2005 | Yoshimura | C04B 35/584 |
| | | | 257/98 |
| 2005/0253500 A1* | 11/2005 | Gotoh | C09K 11/7734 |
| | | | 313/486 |
| 2010/0219395 A1 | 9/2010 | Hirayama et al. | |
| 2010/0225226 A1* | 9/2010 | Murazaki | C09K 11/7734 |
| | | | 313/503 |
| 2011/0266553 A1 | 11/2011 | Ohta et al. | |
| 2016/0268477 A1 | 9/2016 | Fujita et al. | |

OTHER PUBLICATIONS

Oct. 20, 2020, International Preliminary Reporton Patentability issued in the International Patent Application No. PCT/JP2019/016694.

May 21, 2019, International Search Report issued in the International Patent Application No. PCT/JP2019/016694.

* cited by examiner

DEEP ULTRAVIOLET LIGHT-EMITTING ELEMENT

TECHNICAL FIELD

The present disclosure relates to a deep ultraviolet light-emitting element.

BACKGROUND

Group III nitride semiconductors made of a compound of N and Al, Ga, or In are wide-bandgap semiconductors having direct gap band structures, and have been expected as promising materials for a wide variety of applications, including sterilization, water purification, medicine, and illumination. Of these, light-emitting elements having light-emitting layers made of group III nitride semiconductors can be provided for wide wavelength ranges from deep ultraviolet light to visible light, by adjusting the composition ratios of the group III elements. Thus, their applications to a wide variety of light sources have been sought.

Light at wavelengths of 200 nm to 350 nm is referred to as "deep ultraviolet light", and deep ultraviolet light-emitting elements that emit deep ultraviolet light are usually fabricated in the following procedure. Specifically, such elements are fabricated by forming a buffer layer, on a substrate made of sapphire or single-crystalline AlN, and an n-type semiconductor layer, a light-emitting layer, followed by formation of a p-type semiconductor layer, each made of a group III nitride semiconductor, in this order. Subsequently, an n-side electrode and a p-side electrode are formed, which electrically couple to the n-type semiconductor layer and the p-type semiconductor layer, respectively. In order to establish an ohmic contact, a p-type GaN contact layer is typically formed on the p-side electrode side of the p-type semiconductor layer. This is because the hole density can be easily increased in p-type GaN. For the light-emitting layer, a multiple quantum well (MQW) structure is widely used, in which barrier layers and well layers, each made of a group III nitride semiconductor, are alternately stacked.

Further, PTL 1 discloses a nitride light-emitting element wherein an n-type electrode is formed on an n-type contact layer made of an $Al_xGa_{1-x}N$ material (where $0.7 \leq x \leq 1.0$), having an intermediate layer made of an $Al_yGa_{1-y}N$ material (where $0 \leq y \leq 0.5$) interposed therebetween.

The emission center wavelengths of deep ultraviolet light-emitting elements are in the deep ultraviolet range. The tails of emission spectra of deep ultraviolet light-emitting elements extend to a wavelength range of visible light longer than the ultraviolet range that is imperceptible with the naked eye. Thus, when light emitted from a deep ultraviolet light-emitting element is observed with the naked eye, it typically appears as if the deep ultraviolet light-emitting element emits blue light.

CITATION LIST

Patent Literature

PTL 1: JP2010-161311A

SUMMARY

Technical Problem

Deep ultraviolet light-emitting elements are used to illuminate objects, and example of such objects includes food, such as meat. Deep ultraviolet light-emitting elements can be used to sterilize objects, such as food, or to suppress growth of bacteria on or in the objects, by irradiating the objects with deep ultraviolet light emitted by the deep ultraviolet light-emitting elements. In applications where objects such as food are irradiated with deep ultraviolet light, food displayed in stores for sale or dishes to be served in restaurants may be irradiated with deep ultraviolet light.

As described above, conventional deep ultraviolet light-emitting elements emit blue or violet visible light, as well as deep ultraviolet light. When food such as meat is irradiated with blue or violet visible light, the appearance of the food may be impaired because the food, e.g., meat, appears to discolored in the naked eye.

In another application, blue or violet visible light as described above is used to check whether or not light is emitted by a deep ultraviolet light-emitting element. However, when a tool, such as eyeglasses, for blocking ultraviolet light to protect eyes is worn, the tool also cuts blue or violet visible light. This makes it difficult to determine in this procedure whether or not light is emitted by a deep ultraviolet light-emitting element.

Accordingly, an object of the present disclosure is to provide a deep ultraviolet light-emitting element of which color rendering property is adjusted for objects to be illuminated.

Solution to Problem

We have conducted extensive studies on means to solve the above-mentioned problem. We have paid our attention to the finding that a deep ultraviolet light-emitting element in which light other than light in the deep ultraviolet light range appears to be white (or appears to be cyan close to white) by providing a secondary emission including blue-violet light that is induced by a primary emission of deep ultraviolet light, together with a secondary emission including yellow-green light so that the intensity of the blue-violet light and the intensity of the yellow-green light become close to each other, thereby completing the following disclosure. Specifically, the subject matter of the present disclosure is as follows:

(1) A deep ultraviolet light-emitting element comprising, in this order:
   an n-type semiconductor layer;
   a light-emitting layer; and
   a p-type semiconductor layer, the n-type semiconductor layer, the light-emitting layer, and the p-type semiconductor layer each made of a group III nitride semiconductor,
   an emission spectrum of the deep ultraviolet light-emitting element having:
      a primary emission peak wavelength in a wavelength range of 200 nm or more and 350 nm or less,
      a blue-violet secondary light emission component having a relative emission intensity of 0.03% to 10% across a wavelength range of 430 to 450 nm,
      a yellow-green secondary light emission component having a relative emission intensity of 0.03 to 10% across a wavelength range of 540 to 580 nm, when the relative emission intensities are expressed relative to an emission intensity at the primary emission peak wavelength taken as 100%, and
      a ratio of an emission intensity at a wavelength of 435 nm to an emission intensity at a wavelength of 560 nm being 0.5 to 2.

(2) The deep ultraviolet light-emitting element according to the aforementioned (1), wherein
the p-type semiconductor layer comprises a first contact layer configured to emit the blue-violet secondary light emission component, and
the n-type semiconductor layer comprises a second contact layer configured to emit the yellow-green secondary light emission component.
(3) The deep ultraviolet light-emitting element according to the aforementioned (2), wherein the first contact layer and the second contact layer are disposed so as to be arranged alternately.
(4) The deep ultraviolet light-emitting element according to the aforementioned (2) or (3), wherein
the first contact layer is a Mg-doped $A_xGa_{1-x}N$ layer ($0 \leq x \leq 0.3$) having a Mg concentration of $1 \times 10^{18}/cm^3$ or more, and the second contact layer is a Si-doped $Al_yGa_{1-y}N$ layer ($0 \leq y \leq 0.3$) having a Si concentration of $1 \times 10^{18}/cm^3$ or more.

Advantageous Effect

According to the present disclosure, a deep ultraviolet light-emitting element of which color rendering property is adjusted for objects to be illuminated can be provided.

BRIEF DESCRIPTION OF THE DRAWINGS

In the accompanying drawings.

DETAILED DESCRIPTION

Figure 1A:
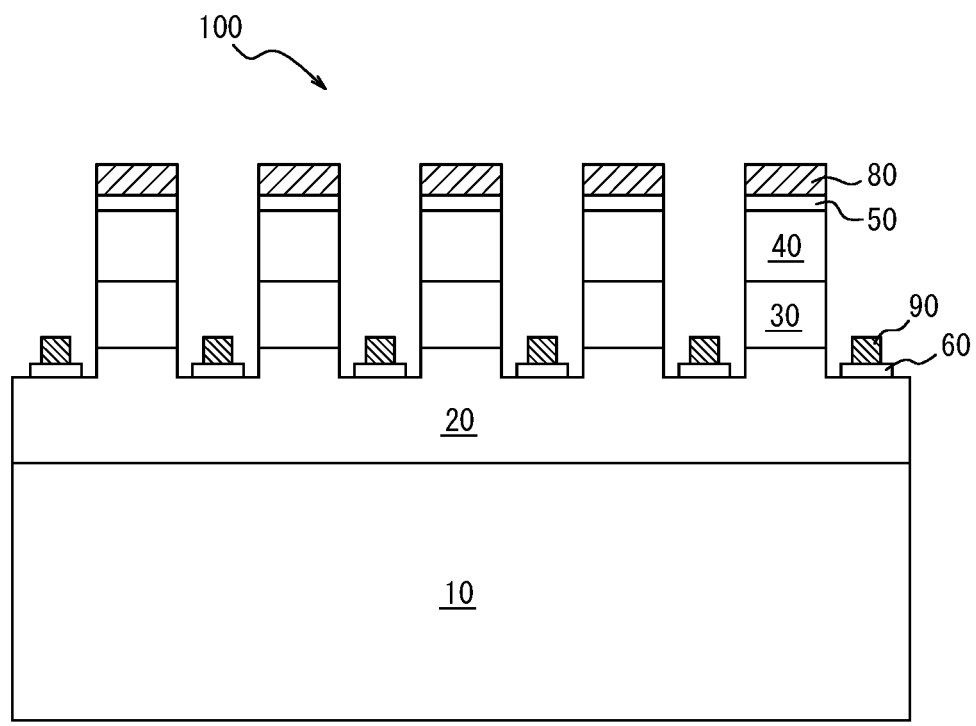
FIG. 1A is a schematic cross-sectional view of a deep ultraviolet light-emitting element according to an embodiment of the present disclosure.

Prior to describing embodiments of this disclosure, the following points are described beforehand. First, the term "AlGaN" alone for which the Al composition ratio is not specified means a given compound having a chemical composition ratio of group III elements (Al and Ga in total) with respect to N of 1:1 and any given ratio between the group III elements of Al and Ga. In this case, even if no reference is made to In that is a group III element, In may be contained at 5% or less with respect to the III elements of Al and Ga. Further, In may be contained at 10% or less in a first contact layer and a second contact layer, which will be described later. In addition, the term "AlN" or "GaN" alone does not mean the composition ratio contains Ga or Al, respectively. Yet, the simple term "AlGaN" does not exclude AlN and GaN. Note that the value of the Al composition ratio can be measured for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Mg and Si and does not serve as an electrically p- or n-type layer is referred to as an "i-type" or "undoped" layer. An undoped layer may contain impurities that are inevitably mixed in the production process. Specifically, when the carrier density is low (for example, less than $4 \times 10^{16}/cm^3$), the layer is regarded as being "undoped" in this specification. Further, the values of the impurity concentrations of Mg, Si, etc. are determined by SIMS analyses.

The thickness of each of the epitaxially grown layers can be measured using an interference thickness measurement system. Further, when the composition ratios of the adjacent layers are sufficiently different (for example, the Al composition ratio differs by 0.01 or more), the thickness of each layer can be calculated by observing the cross sections of the grown layers using a transmission electron microscope (TEM). The boundary between two adjacent layers that have the same or substantially the same Al composition ratios (for example, the difference is less than 0.01) but have different impurity concentrations, and the thicknesses of these layers can be determined based on TEM-EDS. The impurity concentrations of these layers can be measured by SIMS analyses. When each of layers is thin as in the case of quantum well structures or superlattice structures, the thickness can be measured using TEM-EDS.

In the present disclosure, the term "primary emission" refers to a light emission of which the emission intensity is the largest in an emission spectrum of a deep ultraviolet light-emitting element (in the emission spectrum, the horizontal axis represents wavelength, whereas the vertical axis represents emission intensity). The wavelength at which the emission intensity is the largest is referred to as the "primary emission peak wavelength". The primary emission peak wavelength of the deep ultraviolet light-emitting element of the present disclosure is in the deep ultraviolet range of 200 nm or more and 350 nm or less. The present disclosure is more effectively applied for a deep ultraviolet light-emitting element having a center emission wavelength of 250 nm or more and 320 nm or less.

In addition to the primary emission, the emission spectrum of the deep ultraviolet light-emitting element according to the present disclosure includes (in the range of 200 nm to 860 nm, for example) a secondary light emission component in the blue-violet wavelength band (from 430 to 450 nm with a representative wavelength of 435 nm) and another secondary light emission component in the yellow-green wavelength band (from 540 to 580 nm with a representative wavelength of 560 nm).

The secondary emissions are generated in response to photoexcitation induced by the primary emission, and thus the emission intensities of the secondary emissions are lower than that of the primary emission. Here, the emission intensities of the secondary emissions are expressed in terms of relative emission intensities (%) which are the emission intensities of the secondary emissions relative to the emission intensity of the primary emission peak wavelength taken as 100% in an emission spectrum with the vertical axis in a logarithmic scale. In the present disclosure, the relative emission intensities of the secondary light emission components are 10% or less, more preferably 1% or less. The relative emission intensities are 0.03% or more, more preferably 0.05% or more. Secondary light emissions with emission intensities of less than 0.03% are too weak, and may not contribute to the color rendering property which is the effect achieved by the present disclosure.

Specifically, in the deep ultraviolet light-emitting element according to the present disclosure:
a blue-violet secondary light emission component is determined to be present when an emission component having a relative emission intensity of 0.03 to 10% is present across the wavelength range of 430 to 450 nm; and a yellow-green secondary light emission component is determined to be present when an emission component with a relative emission intensity of 0.03 to 10% is present across the wavelength range of 540 to 580 nm.

We have conducted intensive studies, which has led to the finding that light emitted by a light-emitting element other than light in the deep ultraviolet light range appears to be white (or appears to be cyan close to white) when the ratio of the emission intensity at 435 nm (blue-violet) to the emission intensity at 560 nm (yellow-green) is 0.5 to 2 in an emission spectrum of the light-emitting element measured. The ratio of the emission intensity at 435 nm (blue-violet) to the emission intensity at 560 nm (yellow-green) in an emission spectrum measured is preferably 0.6 to 1.8, more preferably 0.8 to 1.5

As a matter of course based on the emission intensity of the primary emission peak wavelength, it should be understood that the deep ultraviolet light-emitting element according to the present disclosure is not a white light-emitting element that emits white light as the primary light component but a deep ultraviolet light-emitting element that emits deep ultraviolet light as its primarily component.

The light-emitting element is supplied with a current sufficient to give a primary emission that is sufficient to induce adequate secondary emissions, and the current to be supplied is preferably 40 mA or more so that an emission power of 5 mW or more is output, for example. An emission spectrum may be obtained by mounting an LED chip that has been mounted on an MN submount, on a printed circuit board (PCB), and carrying out a measurement using a spectrometer connected through an optical fiber while supplying a current of 150 mA from a direct-current power source, for example.

As a testing apparatus, PMA-11 Series Spectral Analyzer C7473 (having a measurable wavelength range of 200 to 950 nm) manufactured by Hamamatsu Photonics K.K. is used. In a measurement, a background measurement is carried out for cancelling stray light components, and a spectrum of the LED to be tested is then obtained. The lower limit of the measured wavelength range may be set according to the primary emission peak wavelength of the deep ultraviolet light-emitting element (e.g., the lower limit may be set to a wavelength of 240 nm). Further, in this embodiment, the upper limit of the wavelength range to be measured may be set to 860 nm, for example, because visible light components are important and hence infrared light may not be necessarily measured.

Values of emission intensities are calibrated with a xenon lamp that has been calibrated.

Because the emission intensities of the secondary emissions are smaller than the emission intensity of the primary emission, an emission spectrum with the vertical axis (representing emission intensity) in a logarithmic scale is used to identify secondary emissions.

In cases where the wavelength of the primary emission is longer (e.g., in cases where the peak wavelength thereof is 350 nm), the tail of the primary emission extends to the blue-violet range, which may make the ranges of the secondary light emission components difficult to be identified. Even in such case, white (or cyan close to white) light is observed as long as the relative strengths in the wavelength range of 430 to 450 nm and the wavelength range of 540 to 580 nm satisfy the aforementioned conditions, and the ratio of the emission intensity at a representative wavelength of 435 nm and the emission intensity of a yellow-green (560 nm) component falls within the above range.

An embodiment according to the present disclosure will now be described with reference to the drawings. In principle, like components are denoted by the same reference numerals, and the description of those components will not be repeated. A substrate and layers in each drawing are exaggerated in width and thickness for convenience of description, so that the ratio between the vertical and horizontal dimensions of each illustrated component does not conform to the actual ratio.

(Deep Ultraviolet Light-Emitting Element 100)

Referring to FIG. 1A, a deep ultraviolet light-emitting element 100 according to an embodiment of this disclosure includes an n-type semiconductor layer 20, a light-emitting layer 30, and a p-type semiconductor layer 40, in this order, on a substrate 10, and optionally includes other components.

Figure 1B:
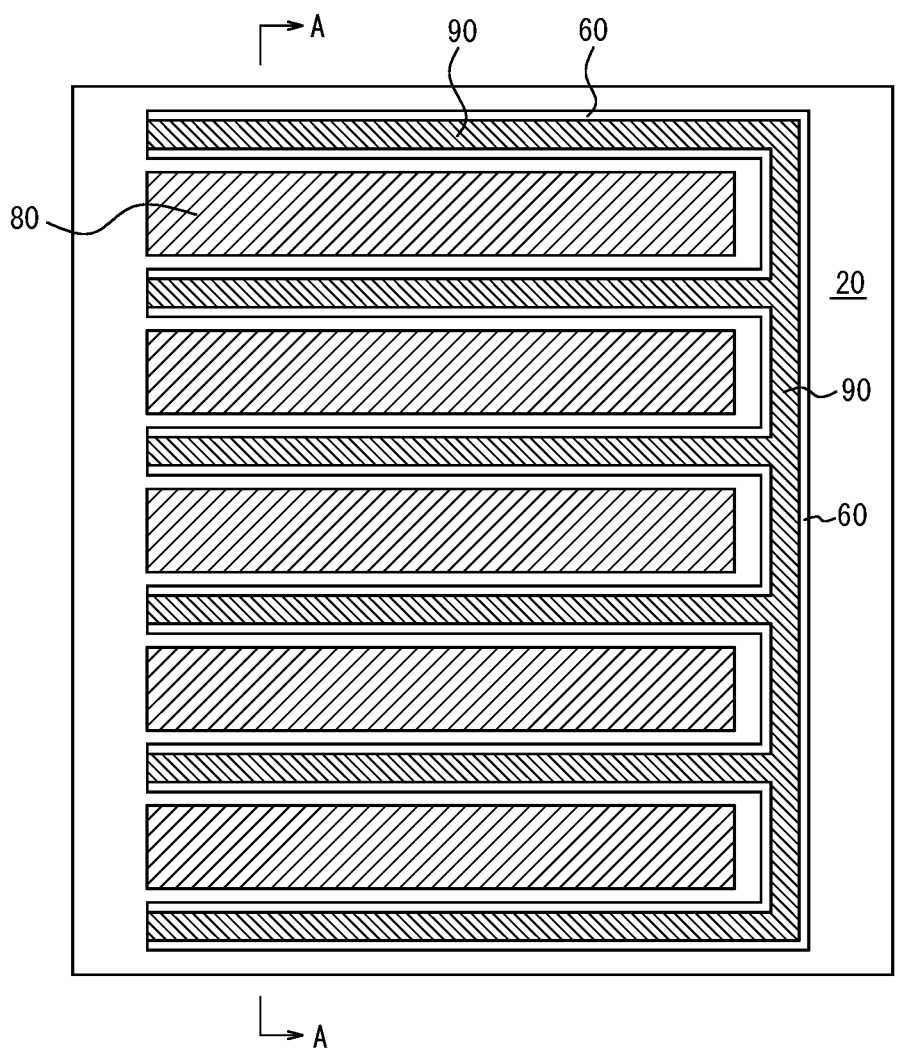
FIG. 1B is a plan view of the deep ultraviolet light-emitting element according to an embodiment of the present disclosure.
Figure 2:
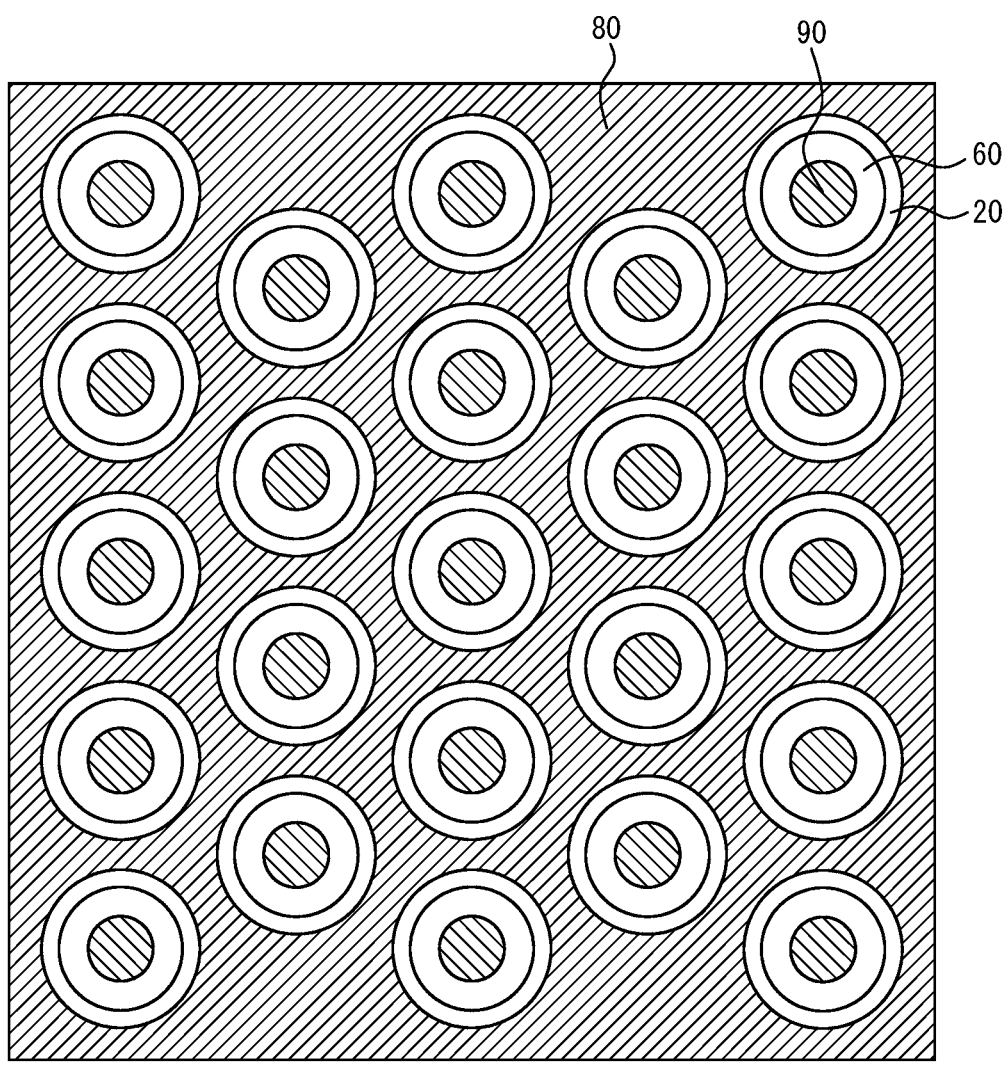
FIG. 2 is a plan view of another mode of a deep ultraviolet light-emitting element according to an embodiment of the present disclosure.

Preferably, the p-type semiconductor layer 40 includes a first contact layer 50 configured to produce a secondary light emission including a blue-violet component in response to being excited by a primary light emission from the light-emitting layer 30, and the n-type semiconductor layer 20 includes a second contact layer 60 configured to produce a secondary light emission including a yellow-green component in response to being excited by the primary light emission. Further, the first contact layer 50 and the second contact layer 60 are preferably disposed so as to be arranged alternately, as illustrated in FIGS. 1A and 1B. Note that FIG. 1A is a cross-sectional view along A-A in FIG. 1B. The expression "the first contact layer 50 and the second contact layer 60 are disposed so as to be arranged alternately" refers to the configuration in which the first contact layer 50 is formed into a strip shape composed of a plurality of strips that are parallel to each other with a gap interposed therebetween, and at least parts of the second contact layer 60 are arranged in the gaps so as to be parallel to each other relative to the plurality of strips, in an imaginary plane (see FIG. 1B) in which the first contact layer 50 and the second contact layer 60 are plan-viewed on the same plane. In cases where the first contact layer 50 and the second contact layer 60 are not arranged alternately in the imaginary plane in which they are plan-viewed, such as in the case where there are an undistributed region where the first contact layer 50 is present dominantly and another undistributed region where the second contact layer 60 is present dominantly, for example, both blue-violet light and yellow-green light would be visible from the light-emitting element. For avoiding such a situation, the first contact layer 50 and the second contact layer 60 is preferably disposed so as to be arranged alternately. Alternatively, the n-type semiconductor layer 20 and the second contact layer 60 may be arranged so as to form a polka dot pattern, as illustrated in FIG. 2.

Note that the second contact layer 60 may be provided on the surface of the n-type semiconductor layer 20 that has been partially exposed by removing the light-emitting layer 30. In FIG. 1A, n-side electrodes 90 are provided on the second contact layer 60.

Although the embodiment illustrated in FIG. 1A exemplifies a flip chip-type deep ultraviolet light-emitting element 100 in which p-type electrodes 80 and the n-type electrodes 90 are arranged on the same side, the present disclosure is not limited to the flip chip-type element as in FIG. 1A. A vertical-type deep ultraviolet light-emitting element may also be possible in which p-type electrodes and n-type electrodes are provided on different sides (opposing sides). Nevertheless, in a vertical-type element, the first contact layer 50 and the second contact layer 60 are preferably arranged so as to be parallel to each other.

In the imaginary plane in which the first contact layer 50 and the second contact layer 60 of the deep ultraviolet light-emitting element 100 are plan-viewed, the area of the first contact layer 50 is preferably comparable to the area of the second contact layer 60. For example, the ratio of the area of the first contact layer to the area of the second contact layer is preferably between 0.5 and 2. When the areas are comparable, the ratio of the emission intensity of the secondary light emission component in the blue-violet wavelength band (from 430 to 450 nm with a representative wavelength of 435 nm) to the emission intensity of the secondary light emission component in the yellow-green wavelength band (from 540 to 580 nm with a representative wavelength of 560 nm) becomes likely to falls within the above range.

Additionally, the deep ultraviolet light-emitting element 100 according to this embodiment may include a buffer layer (e.g., an MN layer) that are interposed, if necessary, on the substrate 10, and can further comprise n-side electrodes 90 on parts of the n-type semiconductor layer 20 and p-side electrodes 80 on the p-type semiconductor layer 40.

Hereinafter, referring to FIGS. 1A and 1B, a preferred mode of the first contact layer 50 and the second contact layer 60, which are characteristic components of the deep ultraviolet light-emitting element 100 according to this embodiment, will be described in more detail.

<First Contact Layer>

The first contact layer 50 according to this embodiment may be disposed anywhere in the p-type semiconductor layer 40, but it is preferably provided at interfaces with the p-type electrodes 80. The composition of the p-type semiconductor layer 40 is required to be to appropriately adjusted so that the p-type semiconductor layer 40 absorbs deep ultraviolet rays emitted from the light-emitting layer 30 to emit secondary light. The first contact layer 50 can be utilize the phenomenon wherein the excitation wavelength in the impurity level of the first contact layer 50 made of a p-type $A_xGa_{1-x}N$ (0≤x≤0.3) doped with Mg which is a p-type dopant is located in the blue to purple range. To achieve an excitation light emission to an extent where even deep ultraviolet light from the light-emitting layer 30 is observable, the average Mg concentration in the film thickness direction (hereinafter, simply referred to as the "Mg concentration") is preferably $1\times10^{18}/cm^3$ or more, for example. For that purpose, the first contact layer 50 preferably also serves as a layer (contact layer) that is in contact with the p-type electrodes 80 to establish ohmic contacts. The p-type $A_xGa_{1-x}N$ of the first contact layer 50 may contain up to 10% of In. Further, for the purpose of achieving a certain light emission intensity of the secondary light emission and/or establishing ohmic contacts with the p-type electrodes 80, the Mg concentration of the first contact layer 50 is more preferably $5\times10^{18}/cm^3$ or more. On the other hand, for preventing an increase in the resistance, the Mg concentration is preferably $1\times10^{21}/cm^3$ or less, more preferably $5\times10^3/cm^3$ or less. The first contact layer 50 may have a superlattice structure. In this case, the layer having the lowest Al composition in the superlattice structure preferably has the Al composition x within the above range (0≤x≤0.3).

<Second Contact Layer>

The second contact layer 60 according to this embodiment is preferably between the n-type semiconductor layer 20 and the n-type electrodes 90. The second contact layer 60 can be utilize the phenomenon wherein the excitation wavelength in the impurity level of the second contact layer 60 made of an n-type $Al_yGa_{1-y}N$ (0≤y≤0.3) doped with Si which is an n-type dopant is located in the yellow or yellow-green range. To achieve an excitation light emission to an extent where even deep ultraviolet light from the light-emitting layer is observable, the average Si concentration in the film thickness direction (hereinafter, simply referred to as the "Si concentration") is preferably $1\times10^{18}/cm^3$ or more, for example. The higher the concentration of Si (e.g., $1\times10^{19}/cm^3$ or more) is, the closer the color of a light emission appears to be yellow than yellow-green because longer-wavelength emission components increase. This makes light emissions appears to be more like white, and hence the Si concentration is more preferably $1\times10^{19}/cm^3$ or more. Further, the second contact layer 60 preferably also serves as a layer (contact layer) that is in contact with the n-type electrodes 90 to establish ohmic contacts. The upper limit of the Si concentration is, but not particularly limited to, preferably $1\times10^{21}/cm^3$ or less where significant degradation of the crystallinity is not caused, and more preferably $1\times10^{21}/cm^3$ or less. In addition, the n-type $Al_yGa_{1-y}N$ of the second contact layer 60 may contain up to 10% of In. Further, the thickness of the second contact layer 60 is preferably 0.1 μm or more, for generating sufficient excitation light emissions. In particular, the second contact layer 60 is preferably a GaN layer because the contact resistance with the electrodes is reduced and a selective growth of GaN to a mask, which will be described later, can be achieved relatively easily. Nevertheless, the "GaN layer" as used therein may include 5% or less of Al or In because the similar effect can also be achieved even in cases where 5% or less of impurities (e.g., Al or In) are contained.

Alternatively, in another embodiment, the element may further include, in a part thereof, a layer that emits red light in response to being excited by light around the emission peak wavelength from the light-emitting layer 30. White light generated by a combination of blue-violet and yellow-green light may have poor color rendering property for red objects, and thus the color rendering property can be improved by provision of a red light-emitting layer.

A red light-emitting layer may be provided in either of the n-type semiconductor layer 20 and the p-type semiconductor layer 40, and may be stacked vertically to the first contact layer 50 or the second contact layer 60 described above, or may be arranged side by side to (partially replaced with) the first contact layer 50 or the second contact layer 60.

The red light-emitting layer can be made from a compound semiconductor containing a group III element (i.e., Al, Ga, or In) and a group V element (i.e., P or As), and may be p- or n-doped. Examples of such III-V semiconductor materials include binary compound semiconductor materials, such as GaAs and GaP; ternary compound semiconductor materials, such as InGaP and AlGaAs; and quaternary compound semiconductor materials, such as AlInGaP and AlInAsP. Further, materials doped with a rare earth element, such as Eu, and quantum dot materials may also be used.

The semiconductor material composing the red light-emitting layer has an even narrower band gap than that of p- or n-type GaN, and hence it might be commonly acknowledged that it would absorb deep ultraviolet light (or it would emit deep ultraviolet light as a secondary source) from its band gap. In reality, through, the reflectance at an interface of AlGaN and GaN is about 1% when the refractive indices are taken into consideration. Thus, the reflectances at an interface with AlGaN or AlGaAs and at an interface between AlGaN and the red light-emitting layer are much larger than the reflectance at an interface with GaN (about 1%). Hence, a part of the contact layer can be used as a reflective layer for deep ultraviolet light by using a semiconductor material having a reflectance of 10% or higher, and preferably 15% or higher to light at a wavelength of 280 nm for allowing for the effects of the crystallinity and flatness. Note that, although the above-described semiconductor materials, such as GaAs, have high reflectances in the deep ultraviolet range, they have low reflectances in the visible light range (400 nm or longer), such as blue or violet light. This behavior in the ultraviolet range enables the red light-emitting layer to serve as a reflective layer, as well as serving as a layer emitting red light.

Here, each of the thicknesses of the first contact layer 50, the second contact layer 60, and the red light-emitting layer is preferably 1 nm to 1000 nm, more preferably 10 to 500 nm. Further, each layer may have a single-layer structure, or may have a superlattice structure having a combination of layers that transmit deep ultraviolet rays (which is made of AlGaN or AlN of which Al composition is adjusted so that a band gap is generated for transmitting deep ultraviolet rays emitted from the light-emitting layer) and layers that absorb the deep ultraviolet rays to provide excitation light emissions. A layer that is provided as a contact layer may be formed thicker.

Note that red light emissions as described above are not required in the present disclosure. Thus, the relative emission intensity across the wavelength range of 581 to 750 nm may be less than 0.10%.

Components other than the first contact layer 50, the second contact layer 60, and the red emitting layer described above in the deep ultraviolet light-emitting element may have structures similar to corresponding components in conventional well-known III-type nitride semiconductor light-emitting elements. Although specific modes of structures applicable to this embodiment will be described below, they are not limitative and any structures may be used.

<Substrate>

The substrate 10 is preferably a substrate that transmits light emitted by the light-emitting layer 30 thereby allowing for extraction of deep ultraviolet light from the substrate side, and may be a sapphire substrate or a single-crystalline AlN substrate, for example. Alternatively, an AlN template substrate may also be used as the substrate 10 in which an undoped AlN layer is epitaxially grown on the surface of a sapphire substrate. The surface of the substrate 10 on the light-emitting layer side or the side opposite to the light-emitting layer or the surface of an AlN layer on an AlN template substrate may be provided with irregularities for improving the light extraction efficiency. For the purpose of reducing dislocation of the AlN layer, annealing at 1500° C. or higher may be carried out.

<Buffer Layer>

Between the substrate 10 and the n-type semiconductor layer 20, a buffer layer may be provided for reducing the lattice mismatch between the substrate 10 and the n-type semiconductor layer 20. The buffer layer may be an undoped group III nitride semiconductor layer, or the buffer layer may be configured to have a superlattice structure or may be a composition gradient layer in which the composition ratio of the group III element has a gradient in the crystal growth direction.

<n-Type Semiconductor Layer>

The n-type semiconductor layer 20 may be provided on the substrate 10, where the buffer layer is interposed therebetween if necessary. The n-type semiconductor layer 20 may be provided directly on the substrate 10. The n-type semiconductor layer 20 may be a typical n-type layer, which can be made of AlGaN, for example. The n-type semiconductor layer 20 is doped with an n-type dopant, thereby functioning as an n-type layer. Examples of the n-type dopant include silicon (Si), germanium (Ge), tin (Sn), sulfur (S), oxygen (O), titanium (Ti), and zirconium (Zr). The dopant concentration is not limited as long as the n-type semiconductor layer 20 can serve as an n-type layer. For example, the dopant concentration can be $1.0\times10^{18}$ atoms/cm$^3$ to $1.0\times10^{20}$ atoms/cm$^3$. In addition, the n-type semiconductor layer 20 preferably has a band gap that is wider than that of the light-emitting layer 30 (or well layers when a quantum well structure is used) and has a transparency to emitted deep ultraviolet light. The n-type semiconductor layer 20 may be composed of a single layer or a plurality of layers. Or, the n-type semiconductor layer 20 may be a composition gradient layer in which the composition ratio of the group III element has a gradient in the crystal growth direction, or may have a superlattice structure. The n-type semiconductor layer 20 functions to improve the crystallinity of the structure from the substrate to the light-emitting layer, as well as functioning to establish the contact with n-type electrodes 90. As described above, the second contact layer 60 may be included in the n-type semiconductor layer 20.

<Light-Emitting Layer>

The light-emitting layer 30 is provided on the n-type semiconductor layer 20. The light-emitting layer 30 in this embodiment is configured such that the light-emitting layer 30 emits light having a center emission wavelength in the deep ultraviolet light range of 200 nm to 350 nm. The light-emitting layer 30 is preferably provided such that the center emission wavelength is 250 nm or more and 320 nm or less.

The light-emitting layer 30 may be composed of a single layer, but it preferably has a multiple quantum well (MQW) structure in which well layers and barrier layers made of AlGaN of different Al composition ratios are repeatedly formed. The layer(s) to emit deep ultraviolet light is the light-emitting layer per se in the case of the single layer structure, or are well layers in the case of the multiple quantum well structure.

The Al composition ratio w of the well layers ($Al_wGa_{1-w}N$) to emit deep ultraviolet light is adjusted such that the deep ultraviolet light has wavelengths of 200 nm to 350 nm in the deep ultraviolet light range or a center emission wavelength is 250 nm or more and 320 nm or less. Such an Al composition ratio w may range from 0.3 to 0.6. In the case of multiple quantum well structure, the Al composition ratio b of the barrier layers ($Al_bGa_{1-b}N$) is adjusted to be higher than the Al composition ratio w of the well layers. For example, provided that b>w, the Al composition ratio b of the barrier layers can range from 0.40 to 0.95. Further, the number of repetitions of the well layers and the barrier layers is not limited in particular, and can be for example one to ten. The layers on both ends of the light-emitting layer 30 in the thickness direction (i.e., the top and bottom layers) are preferably barrier layers. Accordingly, when the number of repetitions of the well layers and the barrier layers is n, those layers are referred to as "n.5 pairs of well layers and barrier layers". The thickness of the well layers can be 0.5 nm to 5 nm, and the thickness of the barrier layers can be 3 nm to 30 nm.

<p-Type Semiconductor Layer>

The p-type semiconductor layer 40 provided on the light-emitting layer 30 may optionally include a p-type electron blocking layer, a p-type cladding layer, and a p-type contact layer, in this order from the side of the light-emitting layer 30. Alternatively, the p-type cladding layer may be omitted, and the p-type electron blocking layer and the p-type contact layer may be formed on the light-emitting layer 30 in this order. The first contact layer 50 described above may also serve as the p-type contact layer.

The p-type electron blocking layer described above is a layer to block flows of electrons and inject the electrons into the light-emitting layer 30 (or the well layers in the case when the light-emitting layer 30 has a multiple quantum well structure) thereby improving the electron injection efficiency. For that purpose, the Al composition ratio z of the p-type electron blocking layer preferably satisfies $0.5 \leq z \leq 1$. Note that when the Al composition ratio z is 0.5 or more, the p-type electron blocking layer may contain up to 5% of In with respect to the amount of the group III elements of Al and Ga. Here, when the light-emitting layer 30 has the above-described multiple quantum well structure having the barrier layers, preferably the Al composition ratio z satisfies the above conditions and is higher than the Al composition ratio b of the barrier layers. In other word, $z > b$ is satisfied.

The thickness of the p-type electron blocking layer is preferably, but not limited to, 10 nm to 80 nm, for example. The thickness of the p-type electron blocking layer in this range ensures a high light output power. Note that the p-type electron blocking layer is preferably thicker than the barrier layers. Examples of p-type dopants doped in the p-type electron blocking layer include magnesium (Mg), zinc (Zn), calcium (Ca), beryllium (Be), and manganese (Mn), and Mg is typically used. The dopant concentration in the p-type electron blocking layer is not particularly limited as long as the layer can serve as a p-type semiconductor layer, and can be $1.0 \times 10^{18}$ atoms/cm$^3$ to $5.0 \times 10^{21}$ atoms/cm$^3$, for example. In addition, for the purpose of improving the lifetime, an element, such as carbon (C), silicone (Si), an germanium (Ge), can be intentionally added to a part of the p-type electron blocking layer. As a matter of course, unintentional impurities, e.g., hydrogen (H), carbon (C), silicon (Si), or oxygen (O), originated from raw materials or an apparatus may also be included in $1.0 \times 10^{16}$ atoms/cm$^3$ or less.

In addition, the p-type cladding layer is a layer having an Al composition ratio that is higher than the Al composition ratio of the layer to emit deep ultraviolet light in the light-emitting layer 30, but is lower than the Al composition ratio z of the p-type electron blocking layer. In other words, both the p-type electron blocking layer and the p-type cladding layer are layers that have Al composition ratios higher than the Al composition ratio of the layer(s) to emit deep ultraviolet light, and substantially transmit deep ultraviolet light emitted from the light-emitting layer 30.

When a p-type cladding layer is provided, it may have a single- or multiple-layer structure, or it may be a composition gradient layer. When the p-type cladding layer has a superlattice laminate structure, an average composition ratio calculated by dividing the sum of the product of the Al composition ratio and the thickness of each layer, by the total thickness, is used as the Al composition ratio of the superlattice laminate. Alternatively, no p-type cladding layer may be provided in the present disclosure. For example, the p-type semiconductor layer may be composed only of the p-type electron blocking layer and the p-type contact layer.

It is also preferable that the mobility of p-type dopants in the p-type contact layer to the light-emitting layer 30 be controlled by locally doping a heterogenous dopant, such as Si, or locally providing undoped regions.

<n-Side Electrodes>

The n-side electrodes 90 may be provided on the exposed surface of the n-type semiconductor layer 20 or on a part of the surface or the entire surface of the second contact layer 60. The n-side electrodes 90 can be formed, for example, as a metal composite film having a Ti-containing film and an Al-containing film formed on the Ti-containing film. Note that, in the deep ultraviolet light-emitting element 100 illustrated in FIGS. 1A, 1B, and 2, parts of the light-emitting layer 30 and the p-type semiconductor layer 40 are removed by etching, for example, and the n-side electrodes 90 are provided on the second contact layer 60 provided on the n-type semiconductor layer 20 that have been exposed.

<p-Side Electrodes>

The p-side electrodes 80 may be formed from well-known materials that are compatible with the above-mentioned materials used for the p-type contact layer.

(Method of Manufacturing Deep Ultraviolet Light-Emitting Element)

The deep ultraviolet light-emitting element 100 can be manufactured by a step of forming an n-type semiconductor layer 20 on a substrate 10, a step of forming a light-emitting layer 30 on the n-type semiconductor layer 20, and a step of forming a p-type semiconductor layer 40 on the light-emitting layer 30. Preferably, the step of forming the p-type semiconductor layer 40 further includes a step of forming a first contact layer 50. Further, the step of forming the n-type semiconductor layer may include a step of forming a second contact layer 60, or it is also preferable to form a second contact layer 60 separately from this step. The conditions to form the corresponding layer in each step can be appropriately adjusted so that the relative strengths of the secondary light emission components, and the ratio of the emission intensity at a wavelength of 435 nm to the emission intensity at a wavelength of 560 nm satisfy the respective conditions described above.

Each layer in each step can be formed by a well-known thin film deposition technique, for example, by metalorganic chemical vapor deposition (MOCVD), molecular beam epitaxy (MBE), hydride vapor phase epitaxy (HYPE), or sputtering. For example, each layer can be formed by MOCVD.

A buffer layer, p-side electrodes 80, and n-side electrodes 90 can also be formed by using generally-used techniques.

EXAMPLES

Although the present disclosure will be described in more detail below with reference to Examples, the present disclosure is not limited to the following Examples.

Example 1

Initially, an AlN layer having a center thickness of 0.60 μm (average thickness: 0.61 μm) was grown (at a growth temperature of 1300° C.) by MOCVD on a sapphire substrate (diameter: 2 inches, thickness: 430 μm, and plane orientation: (0001)) to obtain an AlN template substrate. Upon measuring thicknesses, the thicknesses of total 25 points distributed across the wafer at regular intervals, including the center of the wafer plane, were measured with an interference thickness measurement system (Nanospec M6100A manufactured by Nanometrics Incorporated). Next, the above AlN template substrate was loaded into a heat treatment furnace. The furnace was purged with nitrogen gas to create a nitrogen gas atmosphere in the furnace, followed by raising the temperature inside the furnace, thereby subjecting the AlN template substrate to a heat treatment. In the heat treatment, the heating temperature was 1650° C. and the heating time was 4 hours.

Subsequently, a buffer layer made of undoped $Al_{0.55}Ga_{0.45}N$ and having a thickness of 1.0 μm was formed by MOCVD. Next, an n-type semiconductor layer made of $Al_{0.65}Ga_{0.35}N$ doped with Si and having a thickness of 1.0 μm was formed on the buffer layer. The Si concentration of the n-type semiconductor layer determined by a SIMS analysis was $2.0 \times 10^{19}$ atoms/cm³.

Next, on the n-type semiconductor layer, barrier layers made of $Al_{0.45}Ga_{0.55}N$ with a thickness of 7 nm and well layers made of $Al_{0.20}Ga_{0.80}N$ with a thickness of 3 nm were alternately and repeatedly stacked thereby forming a quantum well structure having 3 pairs of the layers, followed by a formation of a 1-nm layer made of AlN, thereby forming a light-emitting layer. The peak emission wavelength of deep ultraviolet light emitted from the well layers was 310 nm. During the formations of the barrier layers, Si was doped.

Thereafter, a p-type electron blocking layer made of $Al_{0.55}Ga_{0.45}N$ having a thickness of 40 nm was formed on the light-emitting layer using hydrogen gas as a carrier gas. Note that Mg was doped by supplying $CP_2Mg$ gas as a Mg source into the chamber during the formations of the p-type electron blocking layer. The Mg concentration of the p-type electron blocking layer determined by a SIMS analysis was $2.0 \times 10^{18}$ atom/cm³.

Subsequently, a p-type GaN contact layer doped with Mg (Mg concentration: $2 \times 10^{19}$/cm³, and thickness: 0.3 μm) was formed on the p-type electronic blocking layer. Thereafter, as illustrated in FIGS. 1A and 1B, parts of the n-type semiconductor layer were exposed by dry etching. In this step, the p-type GaN contact layer (and the layers below the p-type GaN contact layer) was processed into a strip shape composed of a plurality of strips that were parallel to each other having gaps interposed therebetween, so that the n-type semiconductor layer is exposed in the gaps.

The surface of the n-type semiconductor layer was masked by covering it with a $SiO_2$ film by a CVD technique, except for the exposed regions. An n-type GaN contact layer (Si concentration: $2 \times 10^{19}$/cm³, and thickness: 0.3 μm) was then formed once again by MOCVD on the n-type semiconductor layer (made of $Al_{0.65}Ga_{0.35}N$) that had been exposed.

On this n-type GaN contact layer, n-type electrodes made of a laminate of Ti (20 nm) and Al (600 nm), was formed so as to have a comb-tooth shape as illustrated in FIG. 1B. Further, the $SiO_2$ film on the p-type GaN contact layer in the strip shape was removed, and p-type electrodes made of a laminate of Ni (10 nm) and Au (300 nm) were formed on the p-type GaN contact layer. After contact annealing was carried out, a $SiO_2$ insulating film was formed so that parts of the n-type electrodes and parts of the p-type electrodes were exposed. An n-type pad electrode portion coupling to the n-type electrodes and a p-type pad electrode portions coupling to the p-type electrodes in the strip shapes were formed. Each of the n- and p-type pad electrodes was formed into a structure of Ti/Pt/an $Au_{0.75}Sn_{0.25}$ alloy/Au in this order, on the corresponding electrodes.

The n- and p-type pad electrodes were flip-chip mounted on submounts using a AuSn solder. The light-emitting element was then observed from the light extraction side (sapphire substrate side) under a metallurgical microscope and images were captured by a camera while a current of 100 mA was supplied. The p-type GaN contact layer side was observed to be blue, the n-type GaN contact layer side was observed to be yellow, and the light-emitting element during the test appeared to glow in white in an image captured by the digital camera and in the naked eye.

Figure 3:
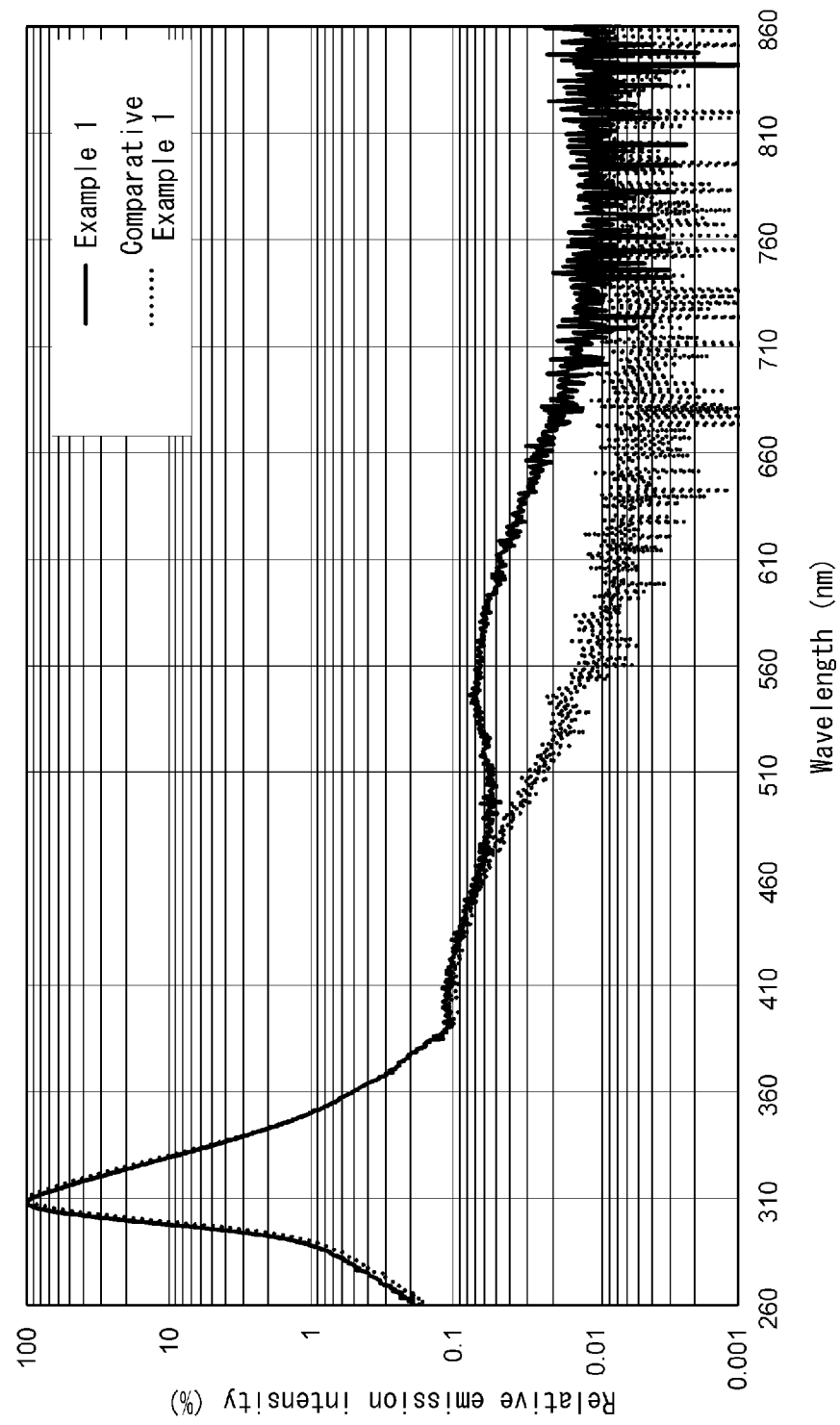
FIG. 3 a graph indicating emission spectra of Example 1 and Comparative Example 1.

Further, an emission spectrum of the deep ultraviolet light-emitting element of Example 1 was obtained using a spectrum analyzer (PMA-11 Series Spectral Analyzer C7473 manufactured by Hamamatsu Photonics K.K.) in a measurement wavelength range of 260 to 860 nm while a current of 150 mA was supplied. The resultant emission spectrum is indicated in FIG. 3.

Comparative Example 1

A deep ultraviolet light-emitting element according to Comparative Example 1 was fabricated in the same manner as in Example 1 except that an n-type electrodes were formed on an n-type semiconductor layer ($Al_{0.65}Ga_{0.35}N$), without carrying out re-growth of an n-type GaN contact layer.

This element was observed in the same manner as in Example 1. No color was observed other than blue on the p-type GaN contact layer side similarly. The light-emitting element during the test appeared to glow in blue in a metallurgical microscope image and in the naked eye. The results of an emission wavelength by the spectrum analyzer which was carried out in the same manner as in Example 1 is indicated in FIG. 3.

The emission spectra of Example 1 and Comparative Example 1 were studied in more detail. As depicted in FIG. 3, in Example 1, a secondary emission including a component at the blue-violet wavelength (435 nm) and a secondary emission including a component at the yellow-green wavelength (560 nm) were observed. The relative emission intensity of the secondary emission including the component at the blue-violet wavelength (435 nm) was 0.07 to 0.09% across the entire range of 430 to 450 nm. The relative emission intensity of the secondary emission including the component at the yellow-green wavelength (560 nm) was 0.06 to 0.08% across the entire range of 540 to 580 nm. In contrast, in Comparative Example 1, a secondary emission including a component at the yellow-green wavelength (560 nm) was scarcely observed. The ratios of the emission intensity at 435 nm to the emission intensity at 560 nm in Example 1 and Comparative Example 1 are summarized in Table 1 below.

TABLE 1

| | Color observed in the naked eye | Ratio of emission intensities (blue-violet (435 nm)/yellow-green (560 nm)) |
|---|---|---|
| Example 1 | white | 1.1 (=0.08/0.07) |
| Comparative Example 1 | blue | 8 (=0.08/0.01) |

Example 2

In place of the p-type GaN contact layer in Example 1, a Mg-doped p-type contact layer having a superlattice structure with 14 layers in total in which seven sets of an $Al_{0.41}Ga_{0.59}N$ layer (2.5 nm) and an $Al_{0.21}Ga_{0.79}N$ layer (5.0 nm) were repeatedly formed in order. Further, on the surface side of the p-type contact layer ($Al_{0.21}Ga_{0.79}N$ layer), a high concentration region (Mg concentration: $3.0 \times 10^{20}$ atoms/cm³) was formed. Except for the above differences, a deep ultraviolet light-emitting element according to Example 2 was fabricated in the same conditions as those in Example 1. In the deep ultraviolet light-emitting element according to Example 2, generation of a secondary light emission including a blue-violet component was confirmed, and the element was observed to glow in white with the naked eye as a result of a combination with a secondary light emission including a yellow-green component by the n-type GaN contact layer in the manner similar to Example 1. Note that the ratio of the emission intensity at a wavelength of 435 nm to the emission intensity at a wavelength of 560 nm was confirmed to be within a range of 0.5 to 2 in Example 2. In this case, it is also possible to use p-type electrodes having a high reflectance to deep ultraviolet light (such as electrodes made of Rh or an alloy thereof, or Al or an alloy thereof, for example).

Example 3

The compositions of the layers composing the deep ultraviolet light-emitting element of Example 1 were changed as follows: the composition of a buffer layer was changed to $Al_{0.70}Ga_{0.30}N$, the composition of an n-type semiconductor layer to $Al_{0.65}Ga_{0.35}N$, the composition of a barrier layer to $Al_{0.64}Ga_{0.36}N$, the composition of a well layer to $Al_{0.45}Ga_{0.55}N$, and the composition of a blocking layer to $Al_{0.68}Ga_{0.32}N$. Except for the above differences, a deep ultraviolet light-emitting element according to Example 3 was fabricated in the same conditions as those in Example 1. In Example 3, the n-type GaN contact layer (Si concentration: $2 \times 10^{19}/cm^3$, and thickness: 0.3 μm) was formed by re-growth in the same manner as in Example 1. Also in Example 3, the element was observed to glow in white with the naked eye while it emitted light, as in Example 1. Note that the ratio of the emission intensity at a wavelength of 435 nm to the emission intensity at a wavelength of 560 nm was confirmed to be within a range of 0.5 to 2 in the deep ultraviolet light-emitting element of Example 3. From the above results, a deep ultraviolet light-emitting element having an emission wavelength other than 310 nm could provide the similar effect by providing the p-type contact layer for emitting secondary light including a blue-violet wavelength (435 nm) component, together with re-growing the n-type GaN contact layer for emitting secondary light including a yellow-green wavelength (560 nm) component and adjusting the ratio of the secondary light emission intensities.

Comparative Example 2

In contrast to the deep ultraviolet light-emitting element according to Example 3 where the n-type GaN contact layer was re-grown, no n-type GaN contact layer was re-grown in Comparative Example 2 similarly to Comparative Example 1 described above. Except for the above difference, a deep ultraviolet light-emitting element according to Comparative Example 2 was fabricated in the same conditions as those in Example 3. In Comparative Example 2, except for blue color observed on the p-type GaN contact layer side, no other color was observed.

INDUSTRIAL APPLICABILITY

According to the present disclosure, a deep ultraviolet light-emitting element of which color rendering property is adjusted for objects to be illuminated can be provided.

REFERENCE SIGNS LIST

10 Substrate
20 n-type semiconductor layer
30 Light-emitting layer
40 p-type semiconductor layer
50 First contact layer
60 Second contact layer
80 p-side electrode
90 n-side electrode
100 Deep ultraviolet light-emitting element

The invention claimed is:

1. A deep ultraviolet light-emitting element comprising, in this order:
    an n-type semiconductor layer;
    a light-emitting layer; and
    a p-type semiconductor layer, the n-type semiconductor layer, the light-emitting layer, and the p-type semiconductor layer each made of a group III nitride semiconductor,
    an emission spectrum of the deep ultraviolet light-emitting element having:
        a primary emission peak wavelength in a wavelength range of 200 nm or more and 350 nm or less,
        a blue-violet secondary light emission component having a relative emission intensity of 0.03% to 10% across a wavelength range of 430 to 450 nm,
        a yellow-green secondary light emission component having a relative emission intensity of 0.03 to 10% across a wavelength range of 540 to 580 nm, when the relative emission intensities are expressed relative to an emission intensity at the primary emission peak wavelength taken as 100%, and
        a ratio of an emission intensity at a wavelength of 435 nm to an emission intensity at a wavelength of 560 nm being 0.5 to 2.

2. The deep ultraviolet light-emitting element according to claim 1, wherein
    the p-type semiconductor layer comprises a first contact layer configured to emit the blue-violet secondary light emission component, and
    the n-type semiconductor layer comprises a second contact layer configured to emit the yellow-green secondary light emission component.

3. The deep ultraviolet light-emitting element according to claim 2, wherein the first contact layer and the second contact layer are disposed so as to be arranged alternately.

4. The deep ultraviolet light-emitting element according to claim 2 wherein
    the first contact layer is a Mg-doped $A_xGa_{1-x}N$ layer (0≤x≤0.3) having a Mg concentration of $1 \times 10^{18}/cm^3$ or more, and
    the second contact layer is a Si-doped $Al_yGa_{1-y}N$ layer (0≤y≤0.3) having a Si concentration of $1 \times 10^{18}/cm^3$ or more.

5. The deep ultraviolet light-emitting element according to claim 3 wherein
    the first contact layer is a Mg-doped $A_xGa_{1-x}N$ layer (0≤x≤0.3) having a Mg concentration of $1 \times 10^{18}/cm^3$ or more, and
    the second contact layer is a Si-doped $Al_yGa_{1-y}N$ layer (0≤y≤0.3) having a Si concentration of $1 \times 10^{18}/cm^3$ or more.

* * * * *